(12) United States Patent
Okamoto et al.

(10) Patent No.: US 7,619,412 B2
(45) Date of Patent: Nov. 17, 2009

(54) MRI APPARATUS AND HIGH-FREQUENCY COIL WITH PLURAL IMAGING REGIONS

(75) Inventors: Kazuya Okamoto, Saitama (JP); Manabu Ishii, Otawara (JP)

(73) Assignees: Kabushiki Kaisha Toshiba, Minato-Ku, Tokyo (JP); Toshiba Medical Systems Corporation, Otawara-Shi, Tochigi (JP)

( * ) Notice: Subject to any disclaimer, the term of this patent is extended or adjusted under 35 U.S.C. 154(b) by 416 days.

(21) Appl. No.: 11/440,053

(22) Filed: May 25, 2006

(65) Prior Publication Data

US 2006/0267588 A1    Nov. 30, 2006

(30) Foreign Application Priority Data

May 26, 2005    (JP)    ............... 2005-154183

(51) Int. Cl.
G01V 3/00    (2006.01)
(52) U.S. Cl. .................. 324/318; 324/321; 324/309
(58) Field of Classification Search ......... 324/318–322, 324/307–309; 600/422, 425, 415; 333/219–235
See application file for complete search history.

(56) References Cited

U.S. PATENT DOCUMENTS

| | | | |
|---|---|---|---|
| 4,613,820 A * | 9/1986 | Edelstein et al. ............ | 324/318 |
| 5,277,183 A | 1/1994 | Vij .............................. | 600/422 |
| 6,426,624 B1 * | 7/2002 | Snelten ........................ | 324/318 |
| 6,496,006 B1 * | 12/2002 | Vrijheid ...................... | 324/318 |
| 6,538,443 B2 * | 3/2003 | Morich et al. ............... | 324/318 |
| 6,750,653 B1 * | 6/2004 | Zou et al. .................... | 324/318 |
| 2004/0220469 A1 | 11/2004 | Jevtic et al. ................. | 600/422 |
| 2006/0267588 A1 * | 11/2006 | Okamoto et al. ............ | 324/318 |

FOREIGN PATENT DOCUMENTS

JP    2005-245798    9/2005

* cited by examiner

Primary Examiner—Brij B. Shrivastav
Assistant Examiner—Tiffany A Fetzner
(74) Attorney, Agent, or Firm—Nixon & Vanderhye PC

(57) ABSTRACT

A high-frequency coil for a magnetic resonance imaging apparatus includes two end members formed of a conductive material and arranged opposite to each other. A plurality of rod members, each of which is formed of a conductive material having a rod shape have one end portion connected to one of the two end members and the other end portion connected to the other of the two end members. At east one additional member is formed of a conductive member having a rod shape, the additional member having both ends connected to one of the rod members, the additional member being disposed outside a first imaging region formed by the end members and the rod members, and forming a second imaging region.

22 Claims, 11 Drawing Sheets

MRI APPARATUS AND HIGH-FREQUENCY COIL WITH PLURAL IMAGING REGIONS

CROSS-REFERENCE TO RELATED APPLICATIONS

This application is based upon and claims the benefit of priority from prior Japanese Patent Application No. 2005-154183, filed May 26, 2005, the entire contents of which are incorporated herein by reference.

BACKGROUND OF THE INVENTION

1. Field of the Invention

The present invention relates to an MRI apparatus and a high-frequency coil for the same, which enable imaging an object to be imaged with a non-cylindrical shape.

2. Description of the Related Art

Magnetic resonance imaging (MRI) is a method in which atomic nuclei spin of a living tissue set in a static magnetic field are excited by a high-frequency signal having a Larmor frequency, and image data is reconstructed on the basis of a magnetic resonance signal generated by the excitation. MRI apparatuses are medical diagnostic apparatuses which obtain diagnostic information by the MRI method. MRI apparatuses are useful in the field of medical diagnosis of today, since they can obtain many kinds of information, for example, not only anatomical information, but also biochemical information and functional information.

To generate image data of high image quality by MRI apparatuses, it is required to efficiently detect a faint MR signal generated in a living body, and many technical contrivances have been made therefore. As high-frequency coils used for detecting MR signals, different types of coils are used according to the direction of the static magnetic field. If the direction of the static magnetic field is horizontal, a saddle coil is used. If the direction of the static magnetic field is vertical, a solenoid coil is used. Although there are cases where a high frequency coil for transmitting a high-frequency signal and a high-frequency coil for receiving an MR signal are provided individually, it is possible to use the same high-frequency coil for the transmission and the reception, since timing of the transmission is different from timing of the reception.

On the other hand, volume coils of QD method are known as high-frequency coils with high sensitivity. Volume coils of birdcage type are generally used for horizontal static magnetic fields. A volume coil of birdcage type has two end rings and at least four rods (elements). The rods are arranged in a substantially parallel state in a direction of the static magnetic field (horizontal direction), and both ends of each rod are connected to the two respective end rings. In particular, birdcage volume coils having four rods are also called "slotted tube resonator". A cylindrical imaging region having a relatively uniform high-frequency magnetic field distribution is formed inside such a volume coil.

In the meantime, if an imaging object is imaged in a high-frequency coil of birdcage type, it is desired that each rod is disposed close to a surface of the imaging object as much as possible. However, in the case of imaging an imaging object with a non-cylindrical shape, such as a region including a shank and a foot, it is required to use a nigh-frequency coil having an internal diameter corresponding to the size of the foot and therefore the shank is distant from the rods. If the high-frequency coil is used as an irradiation coil in such a situation, a larger transmission power is required in comparison with the case of using a high frequency coil having a smaller internal diameter. Further, if the high-frequency coil is used as a reception coil in this situation, the S/N ratio of a detected MR signal deteriorates.

On the other hand, a method of using a surface coil has been developed as a method of detecting MR signals with a good sensitivity. However, since sensitivity distribution in a surface coil is generally nonuniform and is not easily corrected, it is difficult to obtain image data of excellent quality from a surface coil.

As a method of solving the above problem, U.S. Pat. No. 5,277,183 discloses a cylindrical high-frequency coil 500 as shown in FIG. 15. The cylindrical high-frequency coil 500 includes end rings 504 each having an internal diameter corresponding to the thickness of the shank 501. Further, a part of the rods 503 is bent outside in accordance with the shape of a foot 502. In the cylindrical high-frequency coil 500, it is possible to bring the rods 503 close to the whole region of the shank 501 and the foot 502.

However, in the cylindrical high-frequency coil 500, a spatial distribution of a high-frequency magnetic field formed by current flowing through the rods 503 is nonuniform in a region formed by bending the rods 503. Nonuniformity in the high-frequency magnetic field affects the quality of the image data reconstructed.

BRIEF SUMMARY OF THE INVENTION

For the above circumstances, it has been desired to uniformly detect MR signals generated from a non-cylindrical imaging object with high sensitivity.

According to a first aspect of the present invention, there is provided a high-frequency coil for a magnetic resonance imaging apparatus, comprising: two end members formed of a conductive material and arranged opposite to each other; a plurality of rod members, each of which is formed of a conductive material having a rod shape, and has one end portion connected to one of the two end members and the other end portion connected to the other of the two end members; and at least one additional member formed of a conductive member having a rod shape, the additional member having both ends connected to one of the rod members, the additional member being disposed outside a first imaging region formed by the end members and the rod members, and forming a second imaging region.

According to a second aspect of the present invention, there is provided a high-frequency coil for a magnetic resonance imaging apparatus, comprising: two end members formed of a conductive material and is arranged opposite to each other; a plurality of rod members, each of which is formed of a conductive material having a rod shape, and has one end portion connected to one of the two end members and the other end portion connected to the other of the two end members; at least one additional member formed of a conductive member having a rod shape, the additional member having both ends connected to one of the rod members the additional member being disposed outside a first imaging region formed by the end members and the rod members, and forming a second imaging region; and impedance elements inserted in the respective rod members and the additional member.

According to a third aspect of the present invention, there is provided a high-frequency coil for a magnetic resonance imaging apparatus, comprising: two end members formed of a conductive material and arranged opposite to each other; at least four rod members, each of which is formed of a conductive material having a rod shape, and has one end portion connected to one of the two end members and the other end portion connected to the other of the two end members, the rod members being substantially parallel to one another, a first virtual plane including a first and a second rod members among the rod members as two opposing sides is substantially orthogonal to a second virtual plane including a third and a fourth planes among the rod members as two opposing sides; a first additional member formed of a conductive member having a rod shape, the first additional member having both ends connected to one of the rod members, the first additional member being connected to the first rod member, portions of the first additional member crossing and forming a first crossing portion, a third virtual plane including a portion of the first additional member located between the first crossing portion and the first rod member and the first rod member as sides being located in an orientation different from that of a fourth virtual plane including the other portions of the first additional member, the fourth virtual plane being substantially parallel to the first virtual plane; and a second additional member formed of a conductive member having a rod shape, the second additional member having both ends connected to another one of the rod members different from the one connected with the first additional member, the second additional member being connected to the third rod member, portions of the second additional member crossing and forming a second crossing portion, a fifth virtual plane including a portion of the second additional member located between the second crossing portion and the third rod member and the third rod member as sides being located in an orientation different from that of a sixth virtual plane including the other portions of the second additional member as sides, and the sixth virtual plane being substantially parallel to the second virtual plane.

According to a fourth aspect of the present invention, there is provided a magnetic resonance imaging apparatus reconstructing image data based on MR signals radiating from an imaging object placed in a region where a static magnetic field, a gradient magnetic field, and a high-frequency magnetic field are formed, comprising: a high-frequency coil of the first, second or third aspect which uses as at least one of a coil to form the high-frequency magnetic field and a coil to detect the MR signals.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

An embodiment of the present invention is explained with reference to drawings.

A first feature of the embodiment is to form an additional imaging region outside a cylindrical main imaging region, by adding two extension rods to the two respective rods included in a high-frequency coil of a common bird-cage type. The additional imaging region is suitable for imaging, for example, a tiptoe portion of a patient's foot.

A second feature of the embodiment is to uniformly control a high-frequency magnetic field formed in the main imaging region and a high-frequency magnetic field formed in the additional imaging region, by individually adjusting high-frequency currents flowing through the rods and the extension rods.

In the following embodiment, explained is the case where a shank and a foot of human are imaging objects. However, the present invention is not limited to it, but may be used for other imaging objects.

Figure 1:
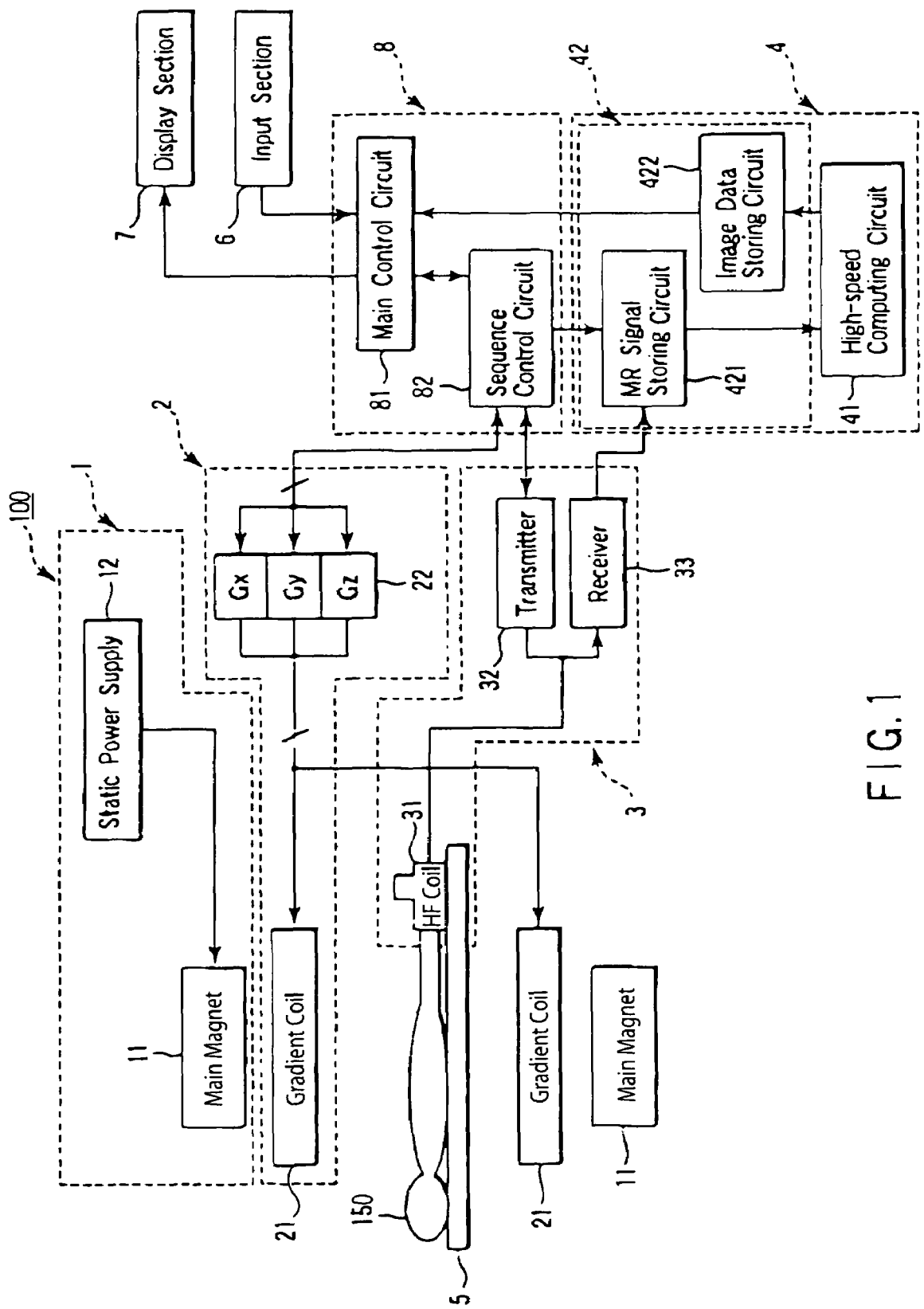
FIG. 1 is a block diagram illustrating a whole structure of an MRI apparatus according to an embodiment of the present invention.

An embodiment of the present invention is explained with reference to FIGS. 1 to 14. FIG. 1 is a block diagram illustrating a whole structure of an MRI apparatus 100 in the embodiment, and FIGS. 2 to 14 are diagrams illustrating a high-frequency coil of the embodiment.

The MRI apparatus 100 comprises a static magnetic field generating section 1, a gradient magnetic field generating section 2, a transmission/reception section 3, a computing and storing section 4, a bed 5, an input section 6, a display section 7, and a control section 8.

The static magnetic field generating section 1 includes a main magnet 11 and a static power supply 12. A superconducting magnet is used as the main magnet 11, for example. The static power supply 12 supplies a current to the main magnet 11. The main magnet 11 operates by current supplied from the static power supply 12, and forms a strong static magnetic field around a subject 150.

The gradient magnetic field generating section 2 includes a gradient coil unit 21, and a gradient power supply 22. The gradient coil unit 21 is formed of a combination of three types of coils corresponding to respective axes of X, Y and Z orthogonal to one another. The gradient power supply 22 individually supplies current to the three coils of the gradient coil unit 21. The gradient power supply 22 individually chances currents to the three respective coils, in response to a control signal supplied from the control section 8. Thereby, it is possible to set the gradient magnetic fields along the respective axes of X, Y and Z to desired gradients. The gradient magnetic fields of the axes of X, Y and Z correspond to, for example, a slice selection gradient magnetic field Gs, a phase encoding gradient magnetic field Ge, and a readout gradient magnetic field Gr, respectively. The gradient magnetic field Gs is used for determining a desired imaging cross section. The gradient magnetic field Ge is used for changing the phase of a magnetic resonance signal in accordance with the spatial is position. The gradient magnetic field Gr is used for changing the frequency of a magnetic resonance signal in accordance with the spatial position. These gradient magnetic fields are superposed on the static magnetic field formed by the main magnet 11.

The transmission/reception section 3 includes a high-frequency coil 31, a transmitter 32 and a receiver 33. The high-frequency coil 31 is supplied with a high-frequency signal from the transmitter 32, and applies RF pulses to the subject 150. The high-frequency coil 31 also detects an MR signal radiating from the subject 150. The transmitter 32 includes a reference signal generator, a modulator, and a power amplifier, etc. The transmitter 32 generates the above high-frequency signal by modulating, with a selection excitation waveform, a reference signal having the same frequency as a magnetic resonance frequency (Larmor frequency) determined in accordance with the intensity of the static magnetic field of the main magnet 11. The MR signal detected by the high-frequency coil 31 is input to the receiver 33. The receiver 33 subjects the MR signal to signal processing and A/D conversion. The signal processing includes intermediate frequency conversion, phase detection, and filtering, etc. The receiver 33 further includes a 90° phase shifter to perform phasing for two MR signals, whose phases are different by 90°, detected by the high-frequency coil 31.

The computing and storing section 4 includes a high-speed computing circuit 41 and a storing circuit 42. The high-speed computing circuit 41 generates image data of an actual space by reconstructing the MR signal transmitted from the receiver 33 through the control section 8 by two-dimensional Fourier transform. The storing circuit 42 includes an MR signal storing circuit 421 and an image data storing circuit 422. The MR signal storing circuit 421 stores MR signals transmitted from the receiver 33. The image data storing circuit 422 stores image data generated by the high-speed computing circuit 41.

The bed 5 moves the subject 150 to a desired position in its body axis direction, to set the subject 150 to a desired imaging position. The bed 5 conveys the subject 150 to the outside of the main magnet 11 through an opening formed in the main magnet 11.

The input section 6 includes various input devices such as a switch, a keyboard, and a mouse, and a console including a display panel. The input section 6 inputs various instructions and information designated by the operator. The instructions and information input by the input section 6 are, for example, patient IDs, instructions to start imaging, information concerning imaging conditions such as imaging method and pulse sequence and a display method, and instructions concerning movement or the bed 5.

The display section 7 includes a display storing circuit, a conversion circuit, and a monitor. The image data stored in the image data storing circuit 422 is supplied to the display section 7 by the control section 8. Further, the display section 7 is supplied with various character or numerical supplementary information, input from the input section 6, by the control section 8. The display section 7 generates display image data by synthesizing the supplied image data and the supplementary information in the display storing circuit. The conversion circuit subjects the display image data to D/A conversion and television format conversion, and thereby obtains an image signal. The monitor displays an image in accordance with the image signal. A CRT or a liquid crystal display or the like is used as the monitor.

The control section 8 includes a main control circuit 81 and a sequence control circuit 82. The main control circuit 81 has a CPU and a storing circuit, and controls the whole apparatus. The storing circuit of the main control circuit 81 stores the information input by the input section 6, concerning the imaging method, pulse sequence, or display method of image data. The CPU of the main control circuit 81 supplies pulse sequence information based on the information input by the input section 6 to the sequence control circuit 82. The pulse sequence information indicates, for example, the magnitude, applying time period, and applying timing of a high-frequency current to be applied to the gradient coil unit 21 and the high-frequency coil 31. The sequence control circuit 82 has a CPU and a storing circuit. The storing circuit of the sequence control circuit 82 stores the pulse sequence information supplied from the main control circuit 81. The CPU of the sequence control circuit 82 controls the gradient power supply 22, the transmitter 32, and the receiver 33 in accordance with the pulse sequence information.

Next, the high-frequency coil 31 is explained in detail.

Figure 2:
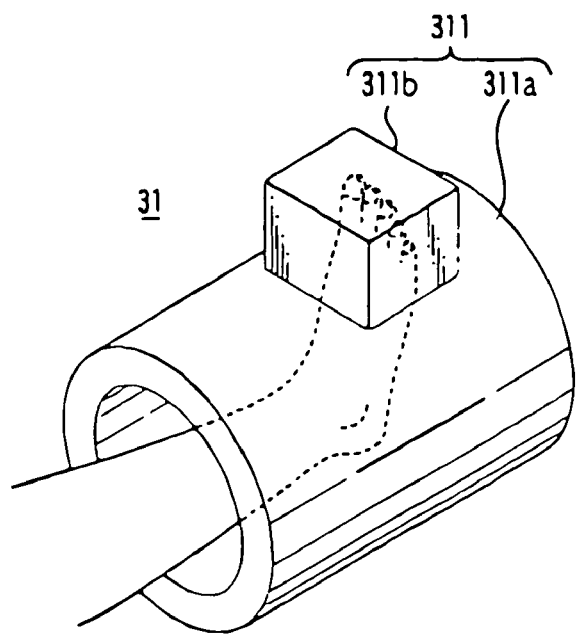
FIG. 2 is a perspective view of an exterior of a high-frequency coil illustrated in FIG. 1.
Figure 3:
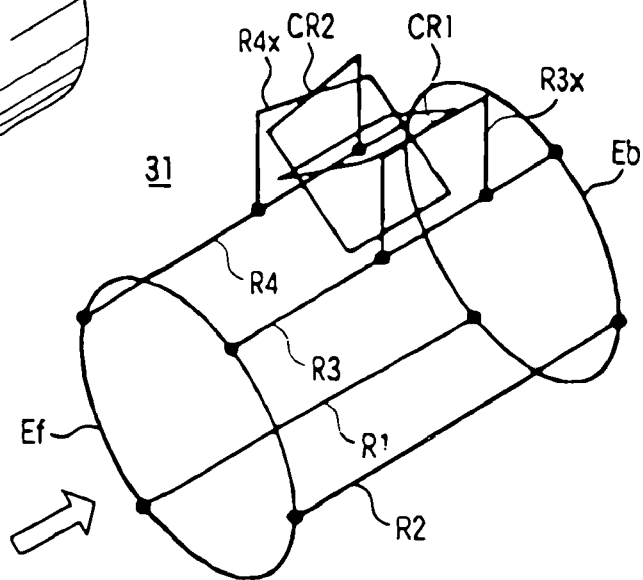
FIG. 3 is a perspective view of a schematic structure of the high-frequency coil illustrated in FIG. 1.
Figure 4:
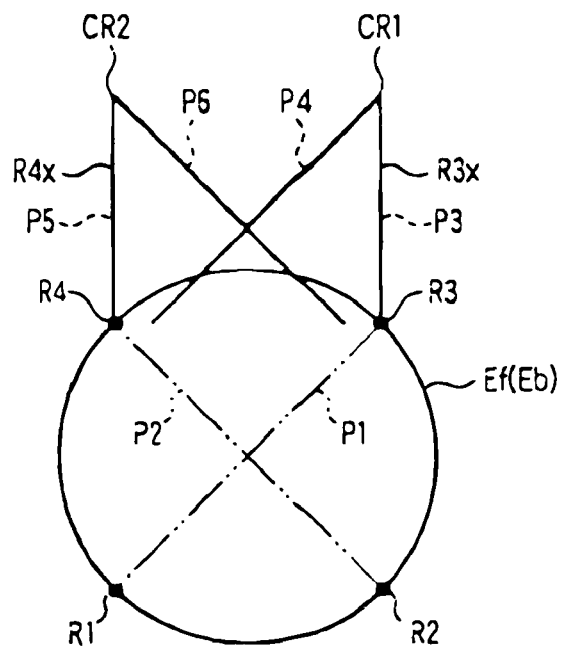
FIG. 4 is a diagram illustrating the schematic structure of the high-frequency coil illustrated in FIG. 3 as viewed from a direction of an arrow illustrated in FIG. 3.

FIG. 2 is a perspective view of an exterior of the high-frequency coil 31. FIG. 3 is a perspective view of a schematic structure of the high-frequency cowl 31. FIG. 4 is a diagram illustrating the schematic structure of the high-frequency coil 31 as viewed from a direction or an arrow illustrated in FIG. 3.

The high-frequency coil 31 has a structure wherein a case 311 illustrated in FIG. 2 contains end rings Ef and Eb, rods R1, R2, R3 and R4, and extension rods R3x and R4x illustrated in FIGS. 3 and 4.

The case 311 comprises a main portion 311a having a cylindrical shape, and a projecting portion 311b having a cube shape. The main portion 311a has an is internal diameter enough to receive a shank and render the internal wall of the main portion 311a close to the shank. The projecting portion 311b is located in a position where a tiptoe of a patient's foot is located when a patient's shank is inserted in the main portion 311a. The projecting portion 311b has a space inside, and the space communicates with the internal space of the main portion 311a. The internal space of the projecting portion 311b has a size enough to receive the patient's tiptoe portion as shown in FIG. 2 and render the internal wall or the projecting portion 311b close to the tiptoe portion.

The end rings Ef and Eb and the rods R1, R2, R3 and R4 are contained in the main portion 311a in the state illustrated in FIG. 3 to be located around the internal surface of the main portion 311a. The extension rods R3x and R4x are contained in the projecting portion 311b in the state illustrated in FIG. 3 to be located around the internal space of the projecting portion 311b.

Each of the end rings Ef and Eb is formed of a conductive material having a ring shape. The end rings Ef and Eb have similar shapes, and are arranged opposite to each other Virtual planes inside the respective end rings Ef and Eb are parallel to each other.

Each of the rods R1, R2, R3 and R4 is formed of a conductive material having a straight-line rod shape. One respective ends of the rods R1, R2, R3 and R4 are connected to the end ring Ef at regular intervals. The other respective ends of the rods R1, R2, R3 and R4 are connected to the end ring Eb at regular intervals. The rods R1, R2, R3 and R4 are arranged along a direction in which the end rings Ef and Eb are aligned. Specifically, the rods R1, R2, R3 and R4 are parallel to one another. By this arrangement, a virtual plane P1 including the rods R1 and R3 as two sides is orthogonal to a virtual plane P2 including the rods R2 and R4 as two sides.

Each of the extension rods R3x and R4x is formed of a conductive material having a rod shape. Both ends of the extension rod R3x are connected to the rod R3. Both ends of the extension rod R4x are connected to the rod R4. The extension rods R3x and R4x are bent to have shapes to satisfy the following conditions.

(1) Portions of the extension rod R3x cross and form a crossing portion CR1.

(2) A virtual plane P3 is formed by sides formed of a portion of the extension rod R3x located between the crossing portion CR1 and the rod R3 and the rod R3, and a virtual plane P4 is formed by sides formed of the other portions of the extension rod R3x.

(3) The plane P4 is substantially parallel to the plane P1, and is not parallel to the plane P3.

(4) Portions of the extension rod R4x cross and form a crossing portion CR2.

(5) A virtual plane P5 is formed by sides formed of a portion of the extension rod R4x located between the crossing portion CR2 and the rod R4 and the rod R4, and a virtual plane P6 is formed by sides formed of the other portions of the extension rod R4x.

(6) The plane P6 is substantially parallel to the plane P2, and is not parallel to the plane P5.

(7) The plane P4 and the plane P6 are orthogonal to each other in the internal space of the projecting portion 311b.

By the above structure, the high-frequency coil 31 forms first and second imaging regions in the internal space of the main portion 311a and the internal space of the projecting portion 311b, respectively. The first and the second imaging regions are connected to each other.

The fundamental structure of the high-frequency coil 31 is as described above.

Although the above structure shows the ideal shapes and positional relationship of the elements of the high-frequency coil 31, the shapes and the positional relationship may be different from the above.

Figure 5:
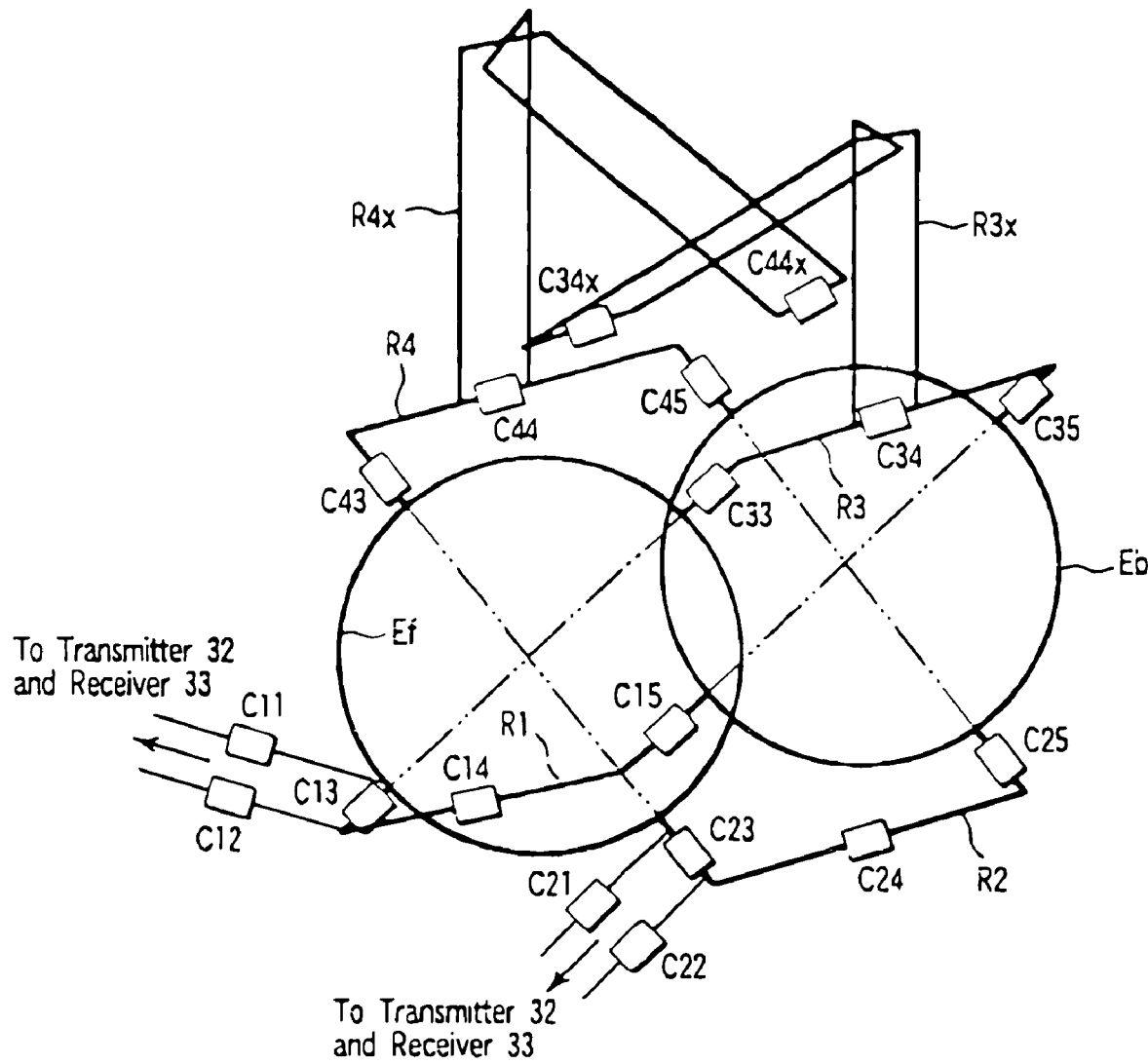
FIG. 5 is a diagram illustrating a specific structure of the high-frequency coil illustrated in FIG. 1.

FIG. 5 is a diagram illustrating a specific structure of the high-frequency coil 31. The structure illustrated in FIG. 5 is based on the above fundamental structure.

The structure of the high-frequency coil 31 shown n FIG. 5 is different from that in FIG. 2 in that both ends of each of the rods R1, R2, R3 and R4 are bent, and that, the high-frequency coil 31 includes capacitors C11, C12, C13, C14, C5, C21, C22, C23, C24, C25, C33, C34, C35, C43, C44, C45, C34x, and C44x.

Both ends of each of the rods R1, R2, R3 and R4 are bent at right angles in the same direction. The rods R1, R2, R3 and R4 have similar shapes. One end of the rod R1 is aligned with one end of the rod R3, the other end of the rod R1 is aligned with the other end of the rod R3, one end of the rod R2 is aligned with one end of the rod R4, and the other end of the rod R2 is aligned with the rod R4. The relative positional relationship of intermediate portions of the rods R1, R2, R3 and R4 is the same as that in the fundamental structure.

The capacitors C13 and C15 are arranged in the vicinity of the respective ends of the rod R1. The capacitors C23 and C25 are arranged in the vicinity of the respective ends of the rod R2. The capacitors C33 and C35 are arranged in the vicinity of the respective ends of the rod R3. The capacitors C43 and C45 are arranged in the vicinity of the respective ends of the rod R4. The capacitors C14, C24, C34 and C44 are arranged about the central portion of the rods R1, R2, R3 and R4, respectively. By this structure, the capacitors C13, C14 and C15 are connected in series by the rod R1. The capacitors C23, C24 and C25 are connected in series by the rod R2. The capacitors C33, C34 and C35 are connected in series by the rod R3. The capacitors C43, C44 and C45 are connected in series by the rod R4.

The capacitor C34 is disposed between positions where the ends of the extension rod R3x are connected to the rod R3. The capacitor C44 is disposed between positions where the ends of the extension rod R4x are connected to the rod R4.

Both ends of the capacitor C13 are connected to respective cables connected to the transmitter 32 and the receiver 33 via impedance matching capacitors C11 and C12, respectively. Both ends of the capacitor C23 are connected to respective cables connected to the transmitter 32 and the receiver 33 via impedance matching capacitors C21 and C22, respectively.

Specifically, a high-frequency current generated in the transmitter 32 is supplied to the high-frequency coil 31 through the both ends of the capacitor C13 or the both ends of the capacitor C23 via the cables. The MR signal detected by the high-frequency coil 31 is supplied to the receiver 33 through the both ends of the capacitor C13 or the both ends of the capacitor C23 via the cables. In the following explanation, a channel through the capacitors C11 and C12 is referred to as a first feeding channel, and a channel through the capacitors C21 and C22 is referred to as a second channel.

Figure 6:
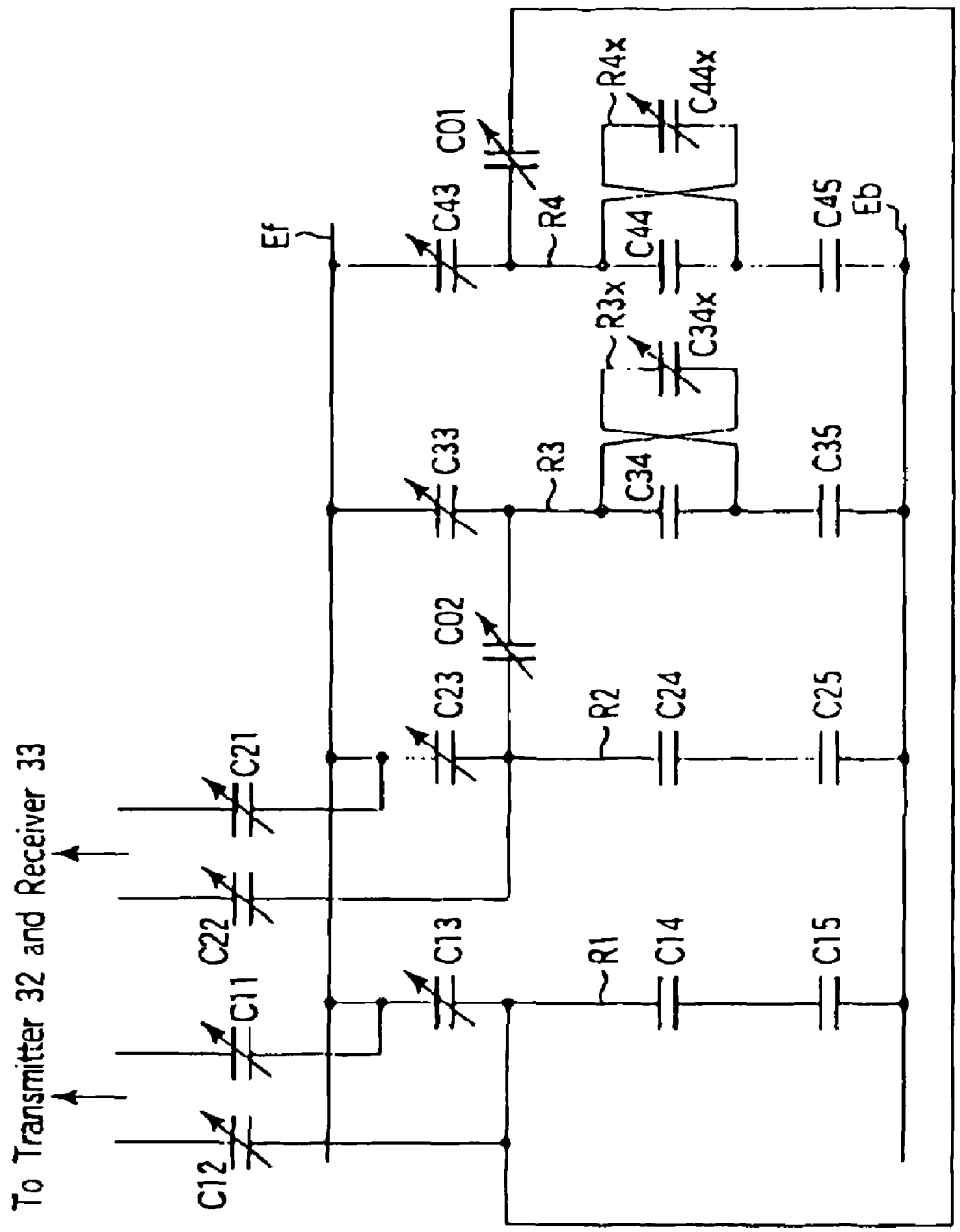
FIG. 6 is an electric equivalent circuit diagram of the high-frequency coil shown in FIG. 5.

FIG. 6 is an electric equivalent circuit diagram of the high-frequency coil shown in FIG. 5.

As shown in FIG. 6, capacity-variable elements are used as the capacitors C11, C12, C13, C21, C22, C23, C34x and C44x. Further, the high-frequency coil 31 includes capacitors C01 and C02 for isolation, although not shown in FIG. 5. Capacity-variable elements are also used as the capacitors C01 and C02.

One end of the capacitor C01 is connected to a portion of the rod R1 located between the capacitors C13 and C14, and the other end of the capacitor C01 is connected to a portion of the rod R4 located between the capacitors C43 and C44. One end of the capacitor C02 is connected to a portion of the rod R2 located between the capacitors C23 and C24, and the other end of the capacitor C02 is connected to a portion of the rod R3 located between the capacitors C33 and C34.

The capacitors C13 and C23 are used for tuning (adjustment of resonant frequency) the first feeding channel and the second feeding channel, respectively. The capacity of the capacitor C13 is adjusted such that a resonant frequency, which is determined on the basis of capacities of the capacitors inserted in series in the rods R1 and R3 and the extension rod R3x and inductance components of the rods and the end rings, substantially corresponds to the Larmor frequency of the high-frequency current. However, in FIG. 6, the inductances of the rods R1, R2, R3 and R4 and the extension rods R3x and R4x are not illustrated.

The capacitors C11, C12, C21, and C22 are used for matching the respective impedances of the first and second feeding channels with the impedances of the transmitter 32 and the receiver 33. For example, the impedances of the first and second feeding channels are set to 50 ohms by adjusting the capacities of the capacitors C11, C12, C21, and C22.

High-frequency currents having different phases by 90° are fed from the transmitter 32 to the respective first and second feeding channels. By this feeding, a rotary high-frequency magnetic field is formed in each of the first and second imaging regions. Thereby, a uniform RF pulse is applied with electric power of ½ that in the case where only one feeding channel is used.

On the other hand, two respective MR signals whose phases are different by 90° are output from the high-frequency coil 31 to the first feeding channel and the second feeding channel. The two MR signals are phased (the 90° phase difference is corrected to 0) and added up in the receiver 33. The sensitivity (S/N) obtained thereby is $\sqrt{2}$ times as much as that of the case of using only one feeding channel, and it enables generation of uniform image data.

Specifically, by adjusting the capacities of the capacitors C01 and C02, the high-frequency current supplied from the transmitter 32 to the first feeding channel through the capacitors C11 and C12 is supplied to the rods R1 and R3 and the extension rod R3x. Further, the high-frequency current supplied to the second feeding channel through the capacitors C21 and C22 is supplied to the rods R2 and R4 and the extension rod R4x.

Next, explained are a high-frequency current flowing through the extension rods R3x and R4x, and a high-frequency magnetic field formed by the high-frequency current.

Figure 8:
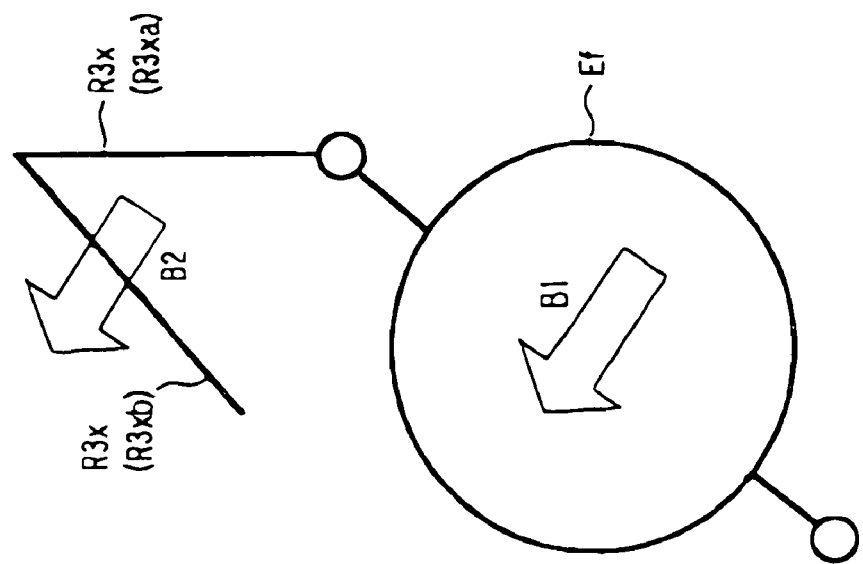
FIG. 8 is a diagram illustrating a state where a high-frequency magnetic field is formed by the high-frequency current illustrated in FIG. 7.
Figure 7:
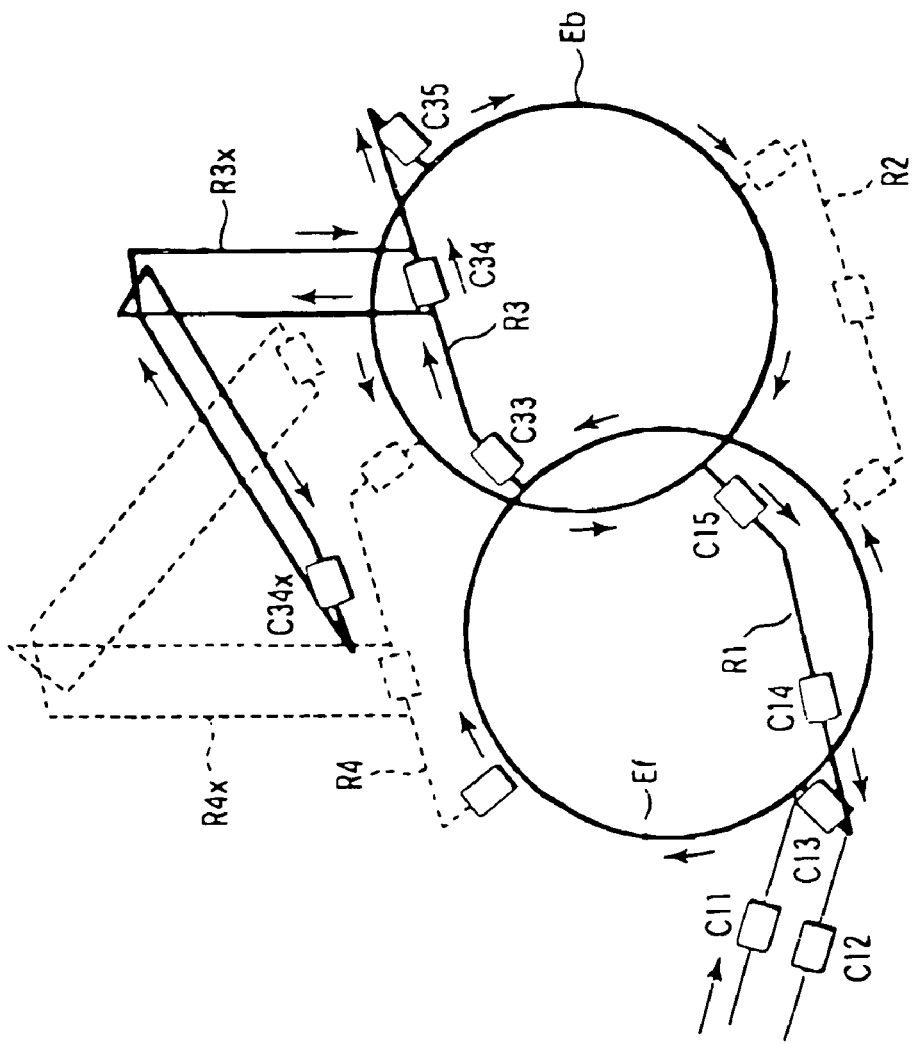
FIG. 7 is a diagram illustrating a state where a high-frequency current occurs in the high-frequency coil illustrated in FIG. 5 by feeding from a first feeding channel.

FIG. 7 is a diagram illustrating a state where a high-frequency current occurs in the high-frequency coil 31 by feeding from the first feeding channel. FIG. 8 is a diagram illustrating a state where a high-frequency magnetic field is formed by the high-frequency current illustrated in FIG. 7.

A high-frequency current fed from the transmitter 32 through the capacitor C11 flows, for example, through the end ring Ef, a part including the rod R3 and the extension rod R3x, the end ring Eb and the rod R1 in this order, and returns to the transmitter 32 through the capacitor C12. In this process, a high-frequency magnetic field B1 illustrated in FIG. 8 is formed with respect to the first imaging region, on the basis of the high-frequency current flowing through the rod R3 and the rod R1. Further, a high-frequency magnetic field 32 is formed with respect to the second imaging region on the basis of the high-frequency current flowing through the extension rod R3x.

Figure 10:
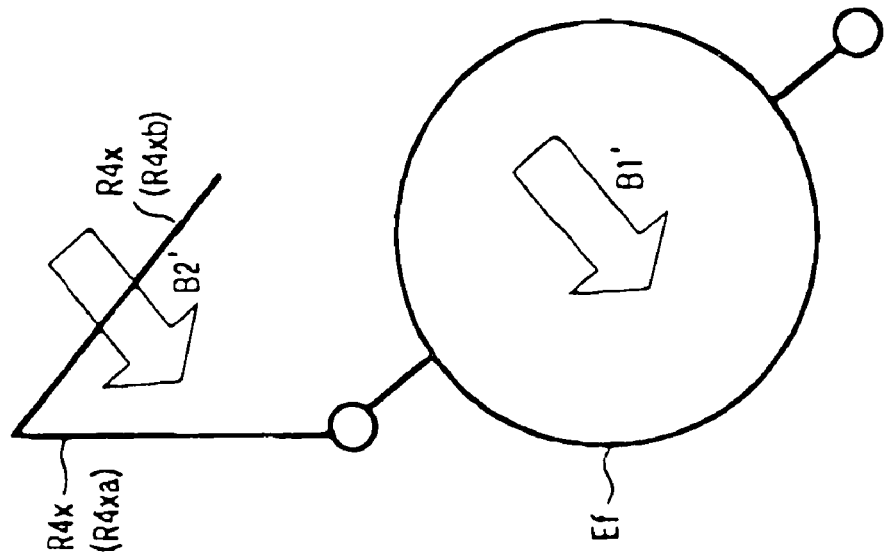
FIG. 10 is a diagram illustrating a state where a high-frequency magnetic field is formed by the high-frequency current illustrated in FIG. 9.
Figure 9:
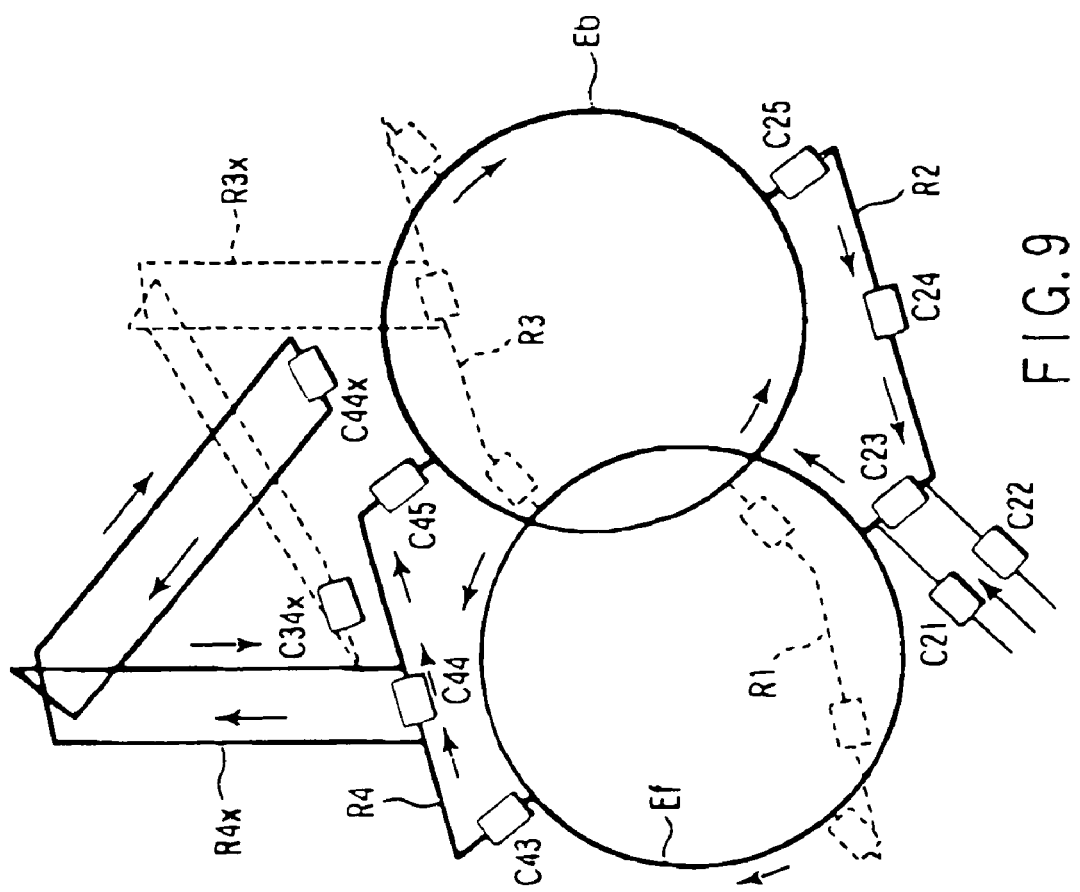
FIG. 9 is a diagram illustrating a state where a high-frequency current occurs in the high-frequency coil illustrated in FIG. 5 by feeding from a second feeding channel.

On the other hand, FIG. 9 is a diagram illustrating a state where a high-frequency current occurs in the high-frequency coil 31 by feeding from the second feeding channel. FIG. 10 is a diagram illustrating a state where a high-frequency magnetic field is formed by the high-frequency current illustrated in FIG. 8.

The high-frequency current fed from the transmitter 32 through the capacitor C21 flows, for example, through the end ring Ef, a part including the rod R4 and the extension rod R4x, the end ring Eb and the rod R2 in this order, and returns to the transmitter 32 through the capacitor C22. In this process, a high-frequency magnetic field B1' illustrated in FIG. 10 is formed with respect to the first imaging region, on the basis of the high-frequency current flowing through the rod R2 and the rod R4. Further, a high-frequency magnetic field B2' is formed with respect to the second imaging region on the basis of the high-frequency current flowing through the extension rod R4x.

Next, an operation of forming the high-frequency magnetic field B2 is formed with respect to the second imaging region is further explained in detail.

Figure 11C:
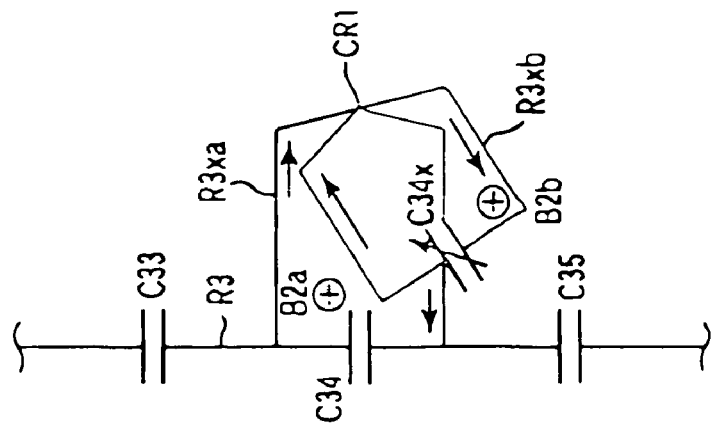
FIGS. 11A, 11B and 11C are diagrams illustrating an electromagnetic function in an extension rod illustrated in FIG. 5.
Figure 11B:
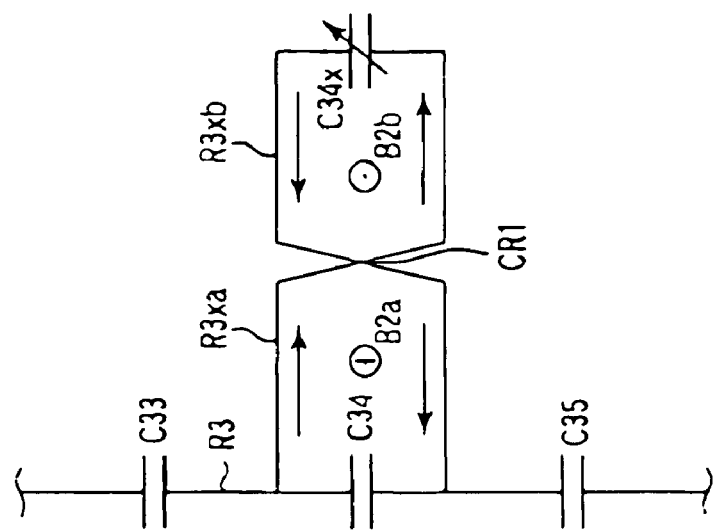
Figure 11A:
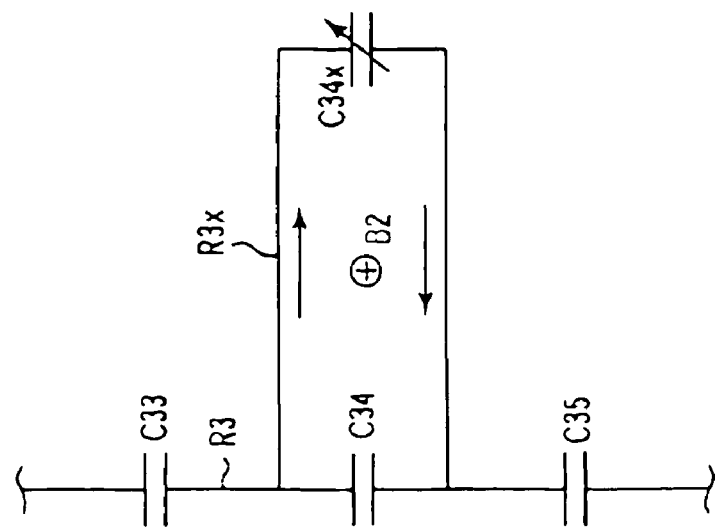

FIG. 11A is a diagram illustrating an equivalent circuit where the extension rod R3x is arranged such that the extension rod R3x and a part of the rod R3 form a rectangular loop. Forming the crossing portion CR1 is equivalent to twisting the extension rod R3x in the state shown in FIG. 11A as illustrated in FIG. 11B. Further, by folding the extension rod R3x at the crossing portion CR1, the equivalent circuit of the actual extension rod R3x is as illustrated in FIG. 11C.

The extension rod R3x is formed of the extension rod R3xa and the extension rod R3xb, and the high-frequency magnetic field 32 in the second imaging region is formed of a composition of the high-frequency magnetic field by the extension rod R3xa and the high-frequency magnetic field by the extension rod R3xb.

However, the high-frequency magnetic field formed by the extension rod R3xb has a more dominant influence than that of the high-frequency magnetic field formed by the extension rod R3xa. Therefore, the high-frequency magnetic field formed by the extension rod R3xb is defined as the high-frequency magnetic field B2. The angle between the plane P3 and the plane P4 may be adjusted, to adjust the orientation of the high-frequency magnetic field B2 in line with the orientation of the high-frequency magnetic field 31 with higher accuracy.

The intensity of the high-frequency magnetic field B2 is changed by changing the capacity of the capacitor C34x. Specifically, the intensity of the high-frequency magnetic field B1 is made equal to the intensity of the high-frequency magnetic field B2 by properly adjusting the capacity of the capacitor C34x.

The high-frequency magnetic field B2' formed by the extension rod R4x has the same structure as that of the high-frequency magnetic field B2 formed by the extension rod R3x described above.

If the capacities of the capacitors C34x and C44x are changed to make the intensities of the high-frequency magnetic fields B2 and B2' equal to the intensities of the high-frequency magnetic fields B1 and B1', respectively, the impedances and resonant frequencies of the feeding channels are also changed. Therefore, if the capacities of the capacitors C34x and C44x are changed, it is necessary to adjust the impedances of the feeding channels by changing the capacities of the capacitors C11, C12, C21 and C22, adjust the resonant frequencies (tuning) by changing the capacities of the capacitors C13 and C23, and adjust the isolation between the feeding channels by charging the capacities of the capacitors C01 and C02. Further, if difference in the impedances and in the resonant frequencies is too large to adjust them only by the adjustment of the above capacitors, it is desired to also adjust the capacity values of the other capacitors inserted in series in the rods.

Ultimately, since the coil 31 becomes equivalent with respect to the first and second feeding channels, the high-frequency magnetic field 31 becomes substantially equal to the high-frequency magnetic field B1', and the high-frequency magnetic field B2 becomes substantially equal to the high-frequency magnetic field B2'.

Detection of the MR signals generated in the imaging object is performed in the same manner as the above formation of high-frequency magnetic field by the high-frequency coil 31 in application of RF pulses to the imaging object. Specifically, the high-frequency coil 31 can detect MR signals having a magnetic field similar to the high-frequency magnetic field formed in transmission. The high-frequency coil 31 detects an MR signal having a magnetic field of the same direction as that of the high-frequency magnetic field B1, and an MR signal having a magnetic field of the same direction as that of the high-frequency magnetic field B1' with respect to the first imaging region. Further, the high-frequency coil 31 detects an MR signal having a magnetic field of the same direction as that of the high-frequency magnetic field B2, and an MR signal having a magnetic field of the same direction as that of the high-frequency magnetic field B2' with respect to the second imaging region. The sensitivity of the high-frequency coil 31 to the MR signals is uniform.

As described above, according to the embodiment, it is possible to form a high-frequency magnetic field in each of the first and second imaging regions, and detect MR signals in each of the first and second imaging regions. Further, it is possible to uniformize spatial distribution of the high-frequency magnetic field in the region for each of the first and second imaging regions. Furthermore, it is possible to uniformize the detection sensitivity of MR signals in each of the first and second imaging regions. Therefore, it is possible to perform imaging in each of the first and the second imaging regions with a uniform image quality in the corresponding region.

Figure 15:
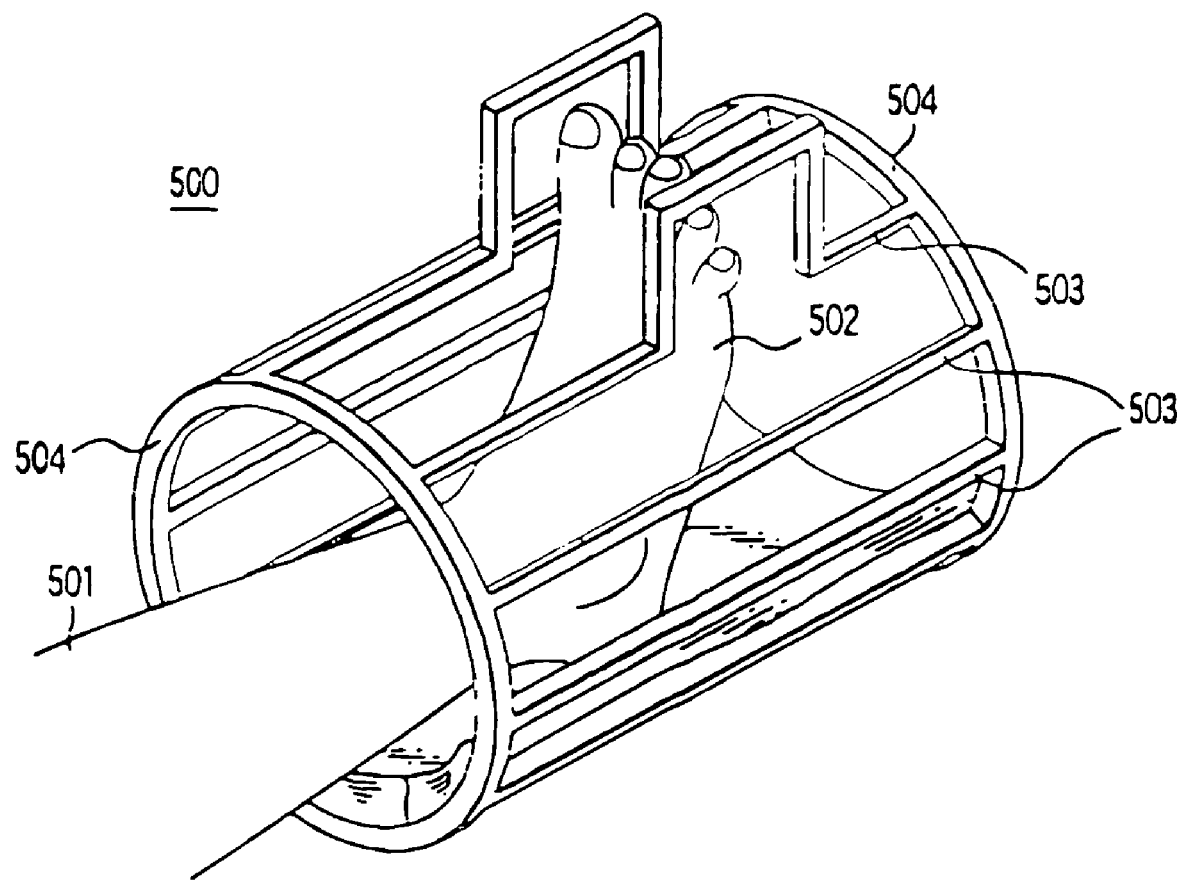
FIG. 15 is a diagram illustrating a structural example of a conventional cylindrical high-frequency coil.

The high-frequency coil disclosed in U.S. Pat. No. 5,277,183 cannot control the high-frequency current flowing through the bent rocs independently of the current of the straight rods. Therefore, it is impossible to make the frequency magnetic field in the cylindrical imaging region formed by the straight rods uniform with the high-frequency magnetic field of the imaging region newly formed by the bent rods. Therefore, in the high-frequency coil illustrated in FIG. 15, image qualities of the two imaging regions are different.

However, according to the embodiment, the high-frequency magnetic fields of the first and second imaging regions can be made uniform. Further, the MR signal detection sensitivities of the first and second imaging regions can be made uniform. Therefore, it is possible to perform imaging with a uniform image quality through the whole area of the first and second imaging regions.

Further, according to the embodiment, high-frequency magnetic fields orthogonal to each other can be formed in each of the first and second imaging regions. Furthermore, it is possible to detect MR signals having orthogonal magnetic fields in each of the first and second imaging regions. Therefore, imaging with high image quality by QD method is performed for each of the first and second imaging regions.

Furthermore, according to the embodiment, the directions of the high-frequency magnetic fields formed in the first and the second imaging regions are the same. Further, it is possible to detect MR signals having the magnetic fields of the same direction between the first and second imaging regions. Therefore, it is possible to obtain a uniform image quality between the first and the second imaging regions.

The present invention is not limited to the above embodiment, but various modifications are possible as follows.

(First Modification)

Figure 12A:
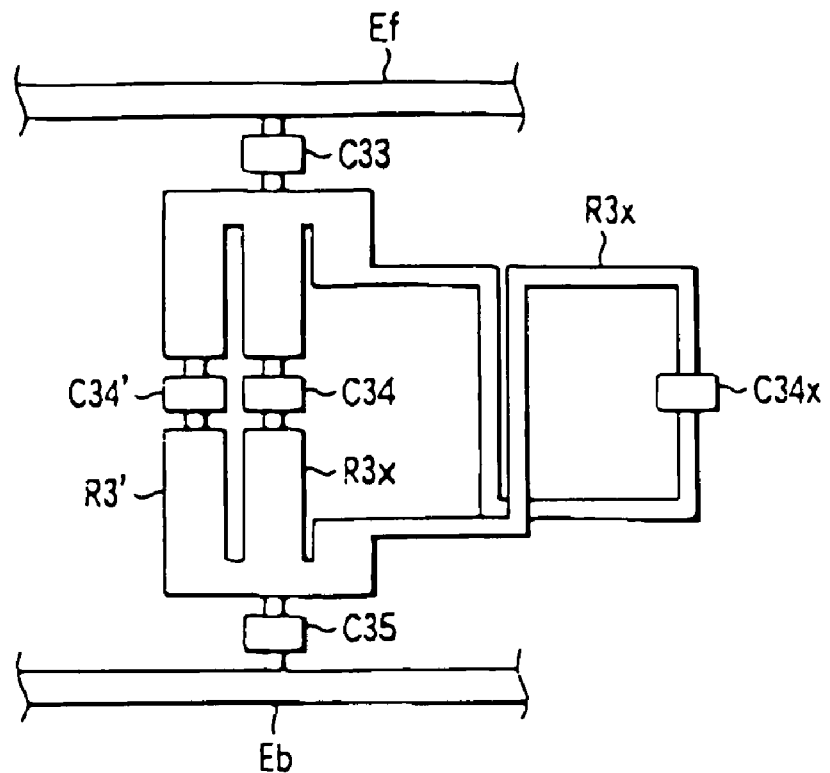
FIGS. 12A and 12B are diagrams illustrating a high-frequency coil in a first modification of the embodiment of the present invention.
Figure 12B:
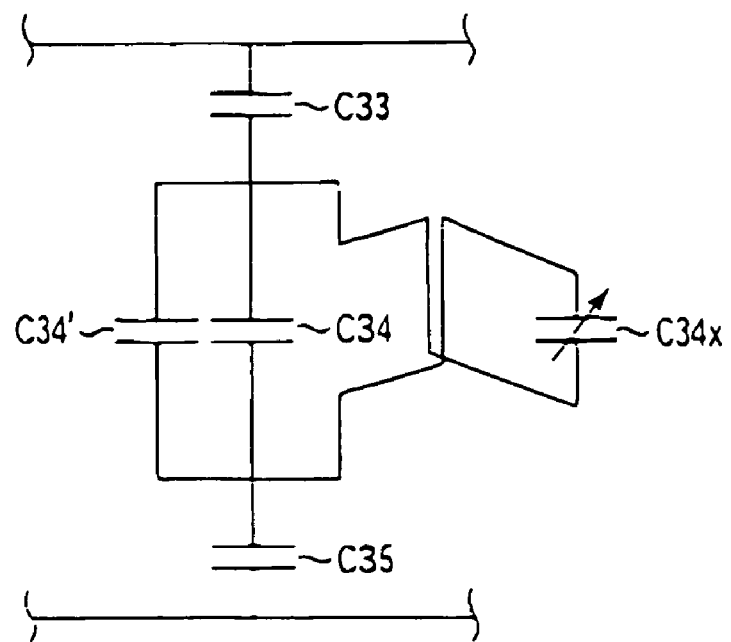

FIGS. 12A and 12B illustrate a modification of the rod R3 with the extension rod R3x. FIG. 12A illustrates an external view of the modification, and FIG. 12B is an electrical equivalent circuit diagram of the modification.

In the modification illustrated in FIG. 12A, a rod R3' is provided in parallel with the rod R3. Each of the end rings Ef and Eb, the rod R3, the additional rod R3' and the extension rod R3x is formed of a thin copper plate. Capacitors C34, C34', and C34x are inserted into the rod R3, the additional rod R3' and the extension rod R3x, respectively.

In this case, additional rods are preferably added to the respective rods R4, R1 and R2. Further, a plurality of additional rods may be added to one rod.

Adding additional rods as described above partly increases the number of rods forming the first imaging region, and thus improves the uniformity of the magnetic field in the first imaging region. Further, forming the rods of thin-plate conductor improves the uniformity of the magnetic field in the first imaging region.

(Second Modification)

Figure 13A:
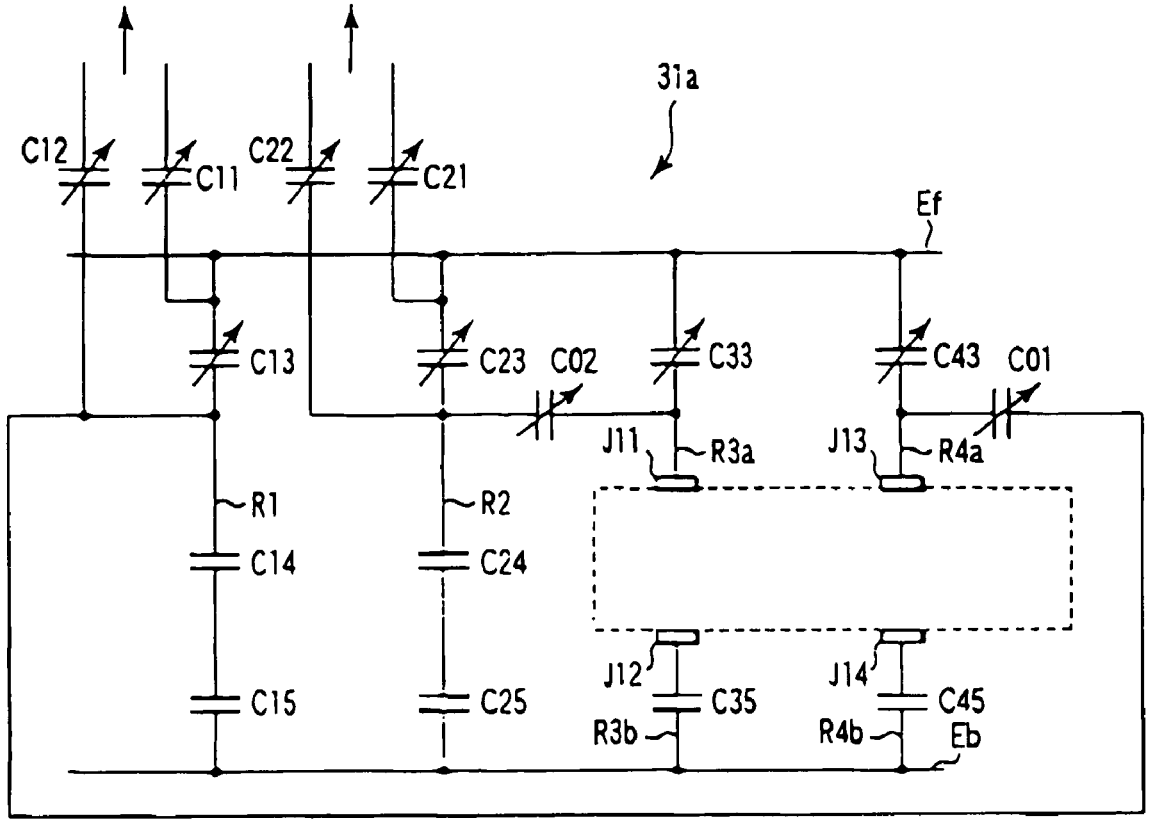
FIGS. 13A, 13B and 13C are diagrams illustrating a structure of a high-frequency coil according to a second modification of the embodiment of the present invention.
Figure 13B:
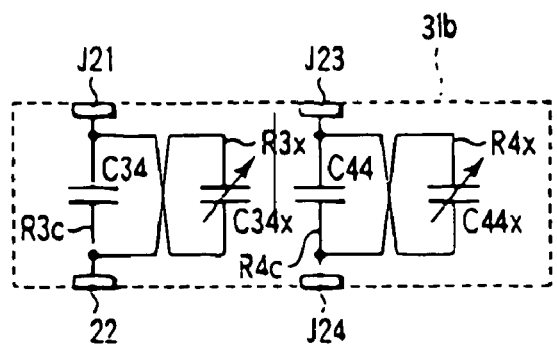
Figure 13C:
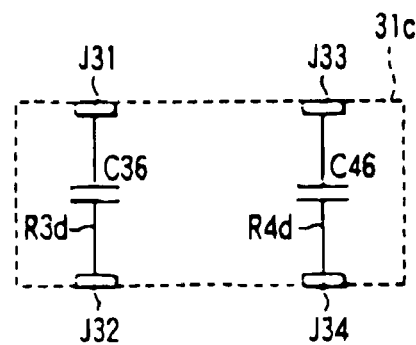

FIGS. 13A, 13B and 13C are electric equivalent circuit diagrams of a first example of a modification of the high-frequency coil in which the extension rods R3x and R4x are detachable.

The high-frequency coil includes a main unit 31a illustrated in FIG. 13A, a detachment unit 31b illustrated in FIG. 13B, and a detachment unit 31c illustrated in FIG. 13C.

The main unit 31a has a structure obtained by cutting the rod R3 at a portion between the capacitors C33 and C34 and a port on between the capacitors C34 and C35, cutting the rod R4 at a port on between the capacitors C43 and C44 and a portion between the capacitors C44 and C45, and removing a part of the rod R3, a part of the rod R4, the capacitors C34, C44, C34x, C44x and the extension rods R3x and R4x from the high-frequency coil 31. Regions corresponding to parts of the rod R3 are referred to as rods R3a and R3b Regions corresponding to parts of the rod R4 are referred to as rod R4a and R4b. Joints J11 and J12 are attached to respective end portions of the rods R3a and R3b, respectively. Joints J13 and J14 are attached to respective end portions of the rods R4a and R4b, respectively.

The detachment unit 31b is the part obtained by removing the main unit 31a from the high-frequency coil 31. The regions corresponding to the rods R3 and R4 are referred to as rods R3c and R4c, respectively. Joints J21 and J22 are attached to one and the other end portions of the rod R3c, respectively. Joints J23 and J24 are attached to one and the other end portions of the rod R4c, respectively.

The detachment unit 31c includes rods R3d and R4d, which correspond to the parts of the rods R3 and R4, respectively, removed from the high-frequency coil 31 in the main unit 31a, and capacitors C36 and C46. Joints J31 and J32 are attached to one and the other end portions of the rod R3d, respectively. Joints J33 and J34 are attached to one and the other end portions of the rod R4d, respectively. The capacitors C36 and C46 are inserted into the rod R3d and R4d, respectively.

If the detachment unit 31b is attached to the main unit 31a by connecting the joints J21, J22, J23 and J24 to the joints J11, J12, J13 and J14, respectively, a high-frequency coil functioning in the same manner as the high-frequency coil 31 is formed. If the extension rods R3x and R4x are not required, the detachment unit 31c is attached to the main unit 31a by connecting the joints J31, J32, J33 and J34 to the joints J11, J12, J13 and J14, respectively. The properties of the capacitors C36 and C46 are to be set such that the rods R1 and R2, a rod formed by connecting the rods R3a, R3b and R3d, and a rod formed by connecting the rods R4a, R4b and R4d perform well-balanced function for transmission and reception in the first imaging region.

(Third Modification)

Figure 14A:
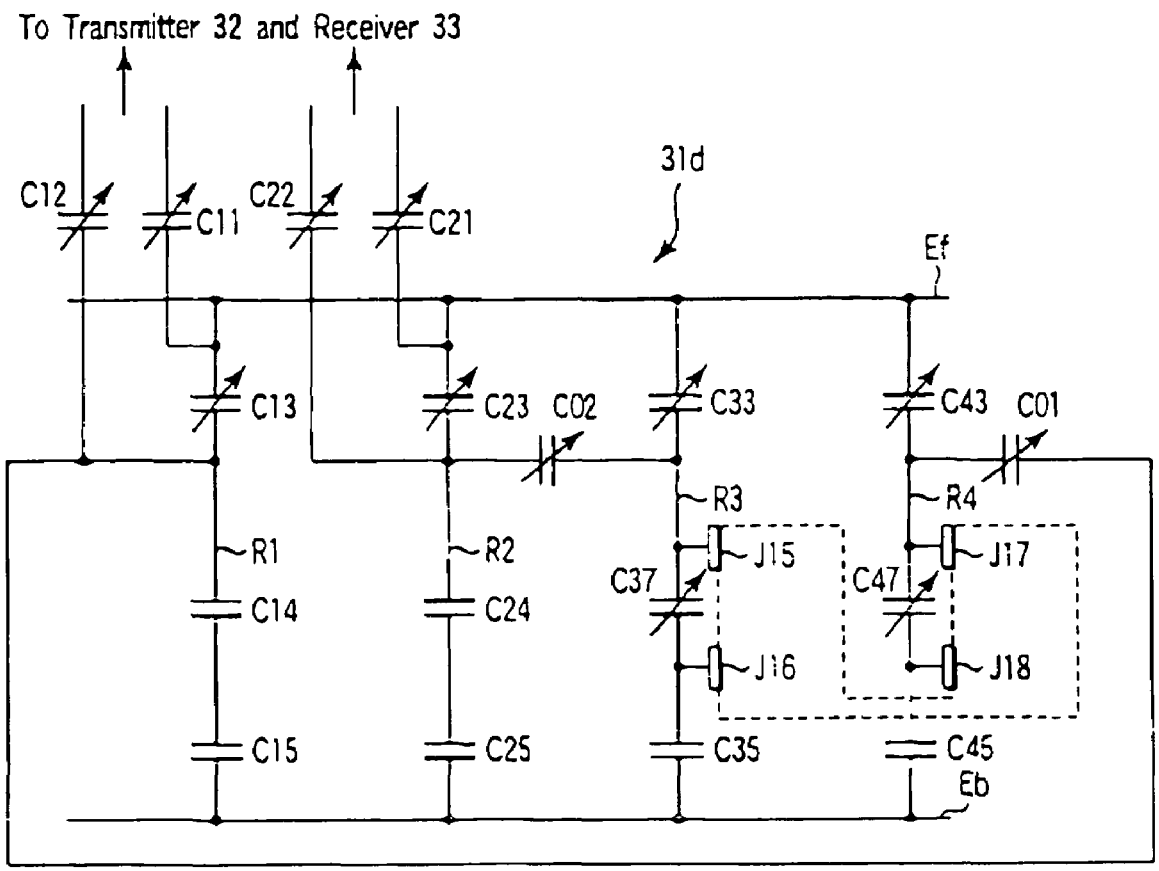
FIGS. 14A and 14B are diagrams illustrating a high-frequency coil according to a third modification of the embodiment of the present invention.
Figure 14B:
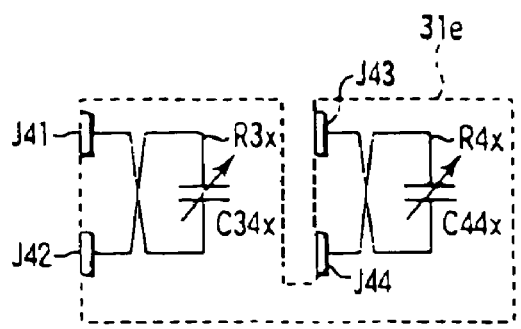

FIGS. 14A and 14B are electric equivalent circuit diagrams of a second example of a modification of the high-frequency coil in which the extension rods R3x and R4x are detachable.

The high-frequency coil includes a main unit 31d illustrated in FIG. 14A and a detachment unit 31e illustrated in FIG. 14B.

The main unit 31d has a structure obtained by cutting the extension rods R3x and R4x at their both ends, removing the extension rods R3x and R4x and the capacitors C34x and C44x from the high-frequency coil 31, and providing capacity-variable capacitors C37 and C47 instead of the capacitors C34 and C44. Joints J15, J16, J17 and J18 are attached to portions where the extension rods R3x and R4x are cut off.

The detachment unit 31e is the part obtained by removing the main unit 31d from the high-frequency coil 31. Joints J41 and J42 are attached to one and the other ends of the extension rod R3x, respectively. Joints J43 and J44 are attached to one and the other ends of the rod R4x, respectively.

If the detachment unit 31e is attached to the main is unit 31d by connecting the joints J41, J42, J43 and J44 to the joints J15, J16, J17 and J18, respectively, a high-frequency coil functioning in the same manner as the high-frequency coil 31 is formed. Capacities of the capacitors C37 and C47 in this case are set to be the same as the capacities of the capacitors C34 and C44.

If the extension rods R3x and R4x are not required, the main unit 31d is operated alone without attaching the detachment unit 31e. Capacities of the capacitors C37 and C47 in this case are to be set such that the rods R1, R2, R3 and R4 perform balanced function for transmission and reception in the first imaging region.

(Other Modifications)

The high-frequency magnetic fields B1 and B2 may be adjusted by adjusting the capacities of the capacitors inserted into the rods R1, R2, R3 and R4, or adjusting the capacities of the capacitors inserted into the additional rods added to the rods R1, R2, R3 and R4.

Rods provided in parallel to the rods R1, R2, R3 and R4 may be increased. The number of rods to be increased may be any desired number.

The end rings Ef and Eb may be divided into two parts such that the divided parts may be jointed with each other. Specifically, the high-frequency coil 31 may be divided into two units which are detachable from each other. Adopting this structure facilitates operation of inserting an imaging object into the high-frequency coil 31 by separating the two units.

Loop-shaped members which do not have ring shapes may be used instead of the end rings Ef and Eb.

A plate-like member may be used instead of the end ring Eb.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A high-frequency coil configured for a magnetic resonance imaging apparatus, said high-frequency coil comprising:
   - two end members formed of a conductive material and arranged opposite to each other;
   - a plurality of first rod members, each of which is formed of a conductive material having a rod shape with one end portion connected to one of the two end members and the other end portion connected to the other one the two end members, wherein each of said first rod members extend continuously without interruption in RF continuity between said end members; and
   - at least one additional member formed of a conductive material also having a rod shape and extending outwardly, laterally and obliquely with respect to said first rod members, both ends of the least one additional member being connected to one of the first rod members at respectively spaced apart points along said one first rod member without interrupting the RF electrical continuity of said one first rod member between said end members, the additional member being disposed outside of a first imaging region formed by the end members and the first rod members, said at least one additional member forming separate second imaging region that extends outside of said first imaging region.

2. A high-frequency coil according to claim 1, said at least one additional member including a plurality of additional members, the additional members each being respectively and similarly connected at both ends to a respectively corresponding different one of the first rod members,
   wherein the second imaging region is formed by the plurality of additional members.

3. A high-frequency coil according to claim 2, wherein:
   two of the additional members are arranged in order to form first and second respective high-frequency magnetic fields in the second imaging region, and the first and the second high-frequency magnetic fields are substantially orthogonal to each other.

4. A high-frequency coil according to claim 3, wherein:
   the first members form third and fourth high-frequency magnetic fields orthogonal to each other in the first imaging region, and
   said two of the additional members are arranged such that the first and second high-frequency magnetic fields have substantially the same directions as those of the third and fourth high-frequency magnetic fields, respectively.

5. A high-frequency coil according to claim 2, wherein:
   two of the additional members have respective loop portions, one of the loop members including a first virtual plane therein, the other of the loop members including a second virtual plane therein, and
   said two of the additional members are arranged such that the first and second virtual planes are substantially orthogonal to each other.

6. A high-frequency coil according to claim 5, wherein:
   the first rod members include at least four first rod members, the four first rod members being arranged to form a third virtual plane including two of the four first rod members as two sides and a fourth virtual plane including the other two first rod members as two sides, the third and fourth virtual planes are substantially orthogonal to each other, and
   the two additional members are arranged such that the first and second virtual planes are parallel to the third and fourth planes, respectively.

7. A high-frequency coil according to claim 1, wherein:
   the two end members and the first rod members are shaped and arranged such that the first imaging region has a cylindrical shape.

8. A high-frequency coil according to claim 1, wherein:
   each of the two end members has a ring shape, and
   the first rod members are arranged along a cylindrical surface of a virtual cylinder including the two end members at opposite ends thereof.

9. A high-frequency coil according to claim 1, further comprising:
   an additional rod member formed of a conductive member also having a rod shape and being connected to one of the first rod members defining the first imaging region.

10. A high-frequency coil as in claim 1 included as part of a magnetic resonance imaging apparatus configured for reconstructing image data based on MR signals radiating from an imaging object placed in a region where a static magnetic field, a gradient magnetic field, and a high-frequency magnetic field are formed, the high-frequency coil being configured for use as at least one of (a) a transmitter coil to form the high-frequency magnetic field and (b) a receiver coil to detect the MR signals.

11. A high-frequency coil configured for a magnetic resonance imaging apparatus, said high-frequency coil comprising:
two end members formed of a conductive material and arranged opposite to each other;
a plurality of first rod members, each of which is formed of a conductive material having a rod shape with one end portion connected to one of the two end members and the other end portion connected to the other one of the two end members;
at least one additional member formed of a conductive member also having a rod shape and extending outwardly, laterally and obliquely with respect to said first rod members with both ends of the at least one additional member being connected to one of the first rod members at respectively spaced apart points along said one first rod member without interrupting the RF electrical continuity of said one first rod member between said end members, the at least one additional member being disposed outside of a first imaging region formed by the end members and the first rod members, the at least one additional member forming a separate second imaging region that extends outside of said first imaging region; and
impedance elements inserted in the respective first rod members and the at least one additional member.

12. A high-frequency coil according to claim 11, wherein properties and arrangement of the reactive impedance elements are determined such that distribution of a high-frequency magnetic field in the first imaging region and distribution of a high-frequency magnetic field in the second imaging region are each substantially uniform.

13. A high-frequency coil according to claim 11, said at least one additional member including a plurality of additional members, the additional members each being similarly connected to a respective different one of the first rod members,
the second imaging region being formed of the additional members.

14. A high-frequency coil according to claim 11, wherein:
one of the impedance elements, which is inserted in a first rod member connected with an additional member, is located between portions of the first rod member to which ends of the additional member are connected.

15. A high-frequency coil according to claim 11, wherein:
two or more of the impedance elements are inserted in each of the first rod members.

16. A high-frequency coil according to claim 11, wherein:
at least two or more of the impedance elements are impedance-variable elements.

17. A high-frequency coil according to claim 11, wherein:
the impedance elements are capacitors.

18. A high-frequency coil as in claim 11 included as part of a magnetic resonance imaging apparatus configured for reconstructing image data based on MR signals radiating from an imaging object placed in a region where a static magnetic field, a gradient magnetic field, and a high-frequency magnetic field are formed,
the high-frequency coil being configured for use as at least one of (a) a transmitter coil to form the high-frequency magnetic field and (b) a receiver coil to detect the MR signals.

19. A high-frequency coil configured for a magnetic resonance imaging apparatus, said high-frequency coil comprising:
two end members formed of a conductive material and arranged opposite to each other;
at least four rod members, each of which is formed of a conductive material having a rod shape with one end portion connected to one of the two end members and the other end portion connected to the other one of the two end members, the rod members being substantially parallel to one another, a first virtual plane including a first and a second of said rod members on two opposing sides being substantially orthogonal to a second virtual plane including a third and a fourth of said rod members on two opposing sides, wherein each of said rod members extends continuously without interruption of RF continuity between said end members;
a first additional member formed of a conductive member also having a rod shape extending outwardly laterally and obliquely with respect to said at least four rod members, both ends of the first additional member being connected to said first rod member at respectively spaced apart points along said first rod member without interrupting the RF electrical continuity of said first rod member between said end members, portions of the first additional member crossing and forming a first crossing portion, a third virtual plane including a portion of the first additional member located between the first crossing portion and the first rod member and the first rod member as sides being located in an orientation different from that of a fourth virtual plane including other portions of the first additional member, the fourth virtual plane being substantially parallel to the first virtual plane; and
a second additional member formed of a conductive member also having a rod shape extending outwardly, laterally and obliquely with respect to said at least four rod members, both ends of the second additional member being connected to said third rod members at respectively spaced apart points along said third rod member without interrupting the RF electrical continuity of said third rod member between said end members, portions of the second additional member crossing and forming a second crossing portion, a fifth virtual plane including a portion of the second additional member located between the second crossing portion and the third rod member and the third rod member as sides being located in an orientation different from that of a sixth virtual plane including other portions of the second additional member as sides, and the sixth virtual plane being substantially parallel to the second virtual plane;
said additional members forming a separate second imaging region that extends outside of said first imaging region formed by said at least four rod members.

20. A high-frequency coil as in claim 19 included as part of a magnetic resonance imaging apparatus configured for reconstructing image data based on MR signals radiating from an imaging object placed in a region where a static magnetic field, a gradient magnetic field, and a high-frequency magnetic field are formed,
the high-frequency coil being configured as at least one of (a) a transmitter coil to form the high-frequency magnetic field and (b) a receiver coil to detect the MR signals.

21. A high-frequency RF coil configured for use in a magnetic resonance imaging apparatus, said high-frequency RF coil comprising:

a birdcage coil module including at least four parallel conductive straight rod members connected between two conductive annular end members without interruption of RF electrical continuity and circumferentially spaced thereabout to form a substantially cylindrical first imaging volume; and an offset additional coil module including at least one bent conductive rod member with two ends being connected to spaced apart points along a respective one of the straight rod members to form a separate second imaging volume extending offset from and outside of said first imaging volume without interrupting the RF electrical continuity of said four parallel conductive straight rod members;

said at least one bent conductive rod member extending outwardly, laterally and obliquely with respect to said straight rod members, said at least one bent conductive rod member being connected to spaced apart points of a respectively associated one of said straight rod members so as to permit RF currents flowing through the birdcage coil module straight rod components and associated with said first imaging volume to be substantially separate and independent of RF currents flowing through the additional coil module bent rod components and associated with said separate second imaging volume.

22. An RF coil as in claim 21, further comprising:

reactive frequency-dependent impedance components interposed serially within at least some of said conductive members.

* * * * *